United States Patent
Ono

(10) Patent No.: US 6,998,317 B2
(45) Date of Patent: Feb. 14, 2006

(54) METHOD OF MAKING A NON-VOLATILE MEMORY USING A PLASMA OXIDIZED HIGH-K CHARGE-TRAPPING LAYER

(75) Inventor: Yoshi Ono, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 127 days.

(21) Appl. No.: 10/741,802

(22) Filed: Dec. 18, 2003

(65) Prior Publication Data

US 2005/0136586 A1  Jun. 23, 2005

(51) Int. Cl.
*H01L 21/00* (2006.01)
*H01L 21/336* (2006.01)

(52) U.S. Cl. .................. 438/287; 438/288; 438/591

(58) Field of Classification Search ............ 438/287, 438/288, 591
See application file for complete search history.

(56) References Cited

U.S. PATENT DOCUMENTS

| 6,008,091 A | 12/1999 | Gregor et al. |
| 6,528,845 B1 | 3/2003 | Bude et al. |
| 6,613,695 B2 * | 9/2003 | Pomarede et al. .......... 438/767 |
| 2002/0000592 A1 | 1/2002 | Fujiwara |

FOREIGN PATENT DOCUMENTS

| WO | WO 0113378 A1 | 2/2001 |
| WO | WO 2003003473 A1 | 1/2003 |

OTHER PUBLICATIONS

Tzeng et al., "Plasma-Charging Effects on Submicron MOS Devices", Jul. 2002, IEEE Transactions on Electron Devices, vol. 49, No. 7, pp. 1151-1157.*

* cited by examiner

*Primary Examiner*—Evan Pert
(74) *Attorney, Agent, or Firm*—David C. Ripma

(57) ABSTRACT

A method of fabricating a non-volatile memory device includes preparing a substrate; depositing a layer of $HfO_2$ by atomic layer deposition; annealing the substrate and $HfO_2$ layer in situ; exposing the $HfO_2$ layer to a plasma discharge, thereby forming a charge-trapping layer; depositing a gate structure; and completing the memory device.

16 Claims, 4 Drawing Sheets

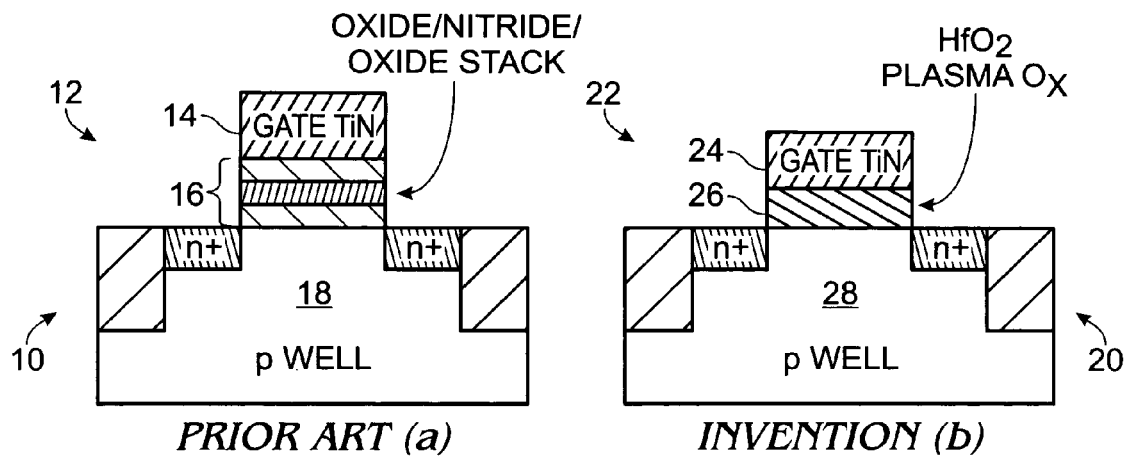
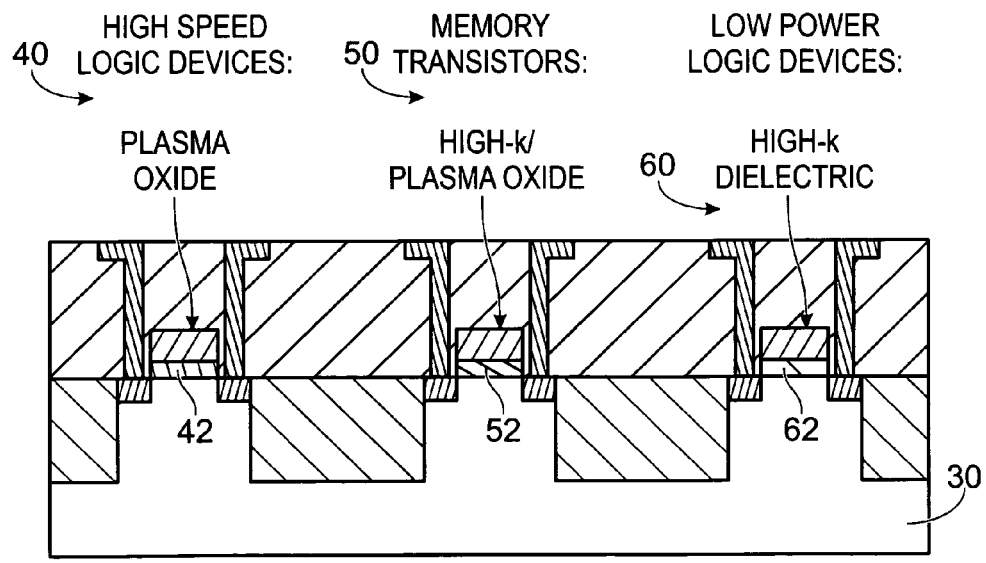

METHOD OF MAKING A NON-VOLATILE MEMORY USING A PLASMA OXIDIZED HIGH-K CHARGE-TRAPPING LAYER

FIELD OF THE INVENTION

This invention relates to non-volatile memory devices, and specifically to a method of fabricating such a device incorporating a high-k charge-trapping layer.

BACKGROUND OF THE INVENTION

The memory technology of this invention is a non-volatile memory technology, similar to that used in EEPROMs, such as flash memories, metal-oxide-nitride-oxide-silicon (MONOS), and silicon-oxide-nitride-oxide-silicon (SONOS). In addition, technologies known as atomic layer deposited (ALD) of high-k dielectrics, in this case, $HfO_2$ film, and low temperature exposure to a plasma discharge, are used in the method of the invention.

Gate dielectrics may be formed in a number of ways. Two distinct methods that show much promise are 1) ALD of high-k films and 2) low temperature plasma oxidation. Each method has been shown to produce a high quality gate dielectric that can be used in conventional MOSFET fabrication flows, each technique having its own advantages.

An important characteristic of material to be used as a gate dielectric is that it does not trap large quantities of charge. Both of the aforementioned fabrication techniques have been demonstrated to produce gate dielectrics having this important characteristic. However, plasma oxidation of an ALD high-k film results in a film in which a large amount of charge may be retained. This is an advantage when used in a non-volatile memory device, in the same fashion as conventional EEPROM, MONOS, or SONOS devices. The amount of charge and the ease of programming and erasing may offer significant advantages over the mentioned memory technologies. FIG. 1 depicts a simplified structure of a prior art MONOS device (a) 10, having a gate stack 12, which includes a gate TiN layer 14 formed over an oxide/nitride/oxide stack 16, all of which is formed on a p-well substrate 18, compared to a device fabricated according to the method of the invention (b), 20, which has a gate stack 22, including a gate TiN layer 24 formed on a layer of $HfO_2$ 26, formed by plasma oxidation on a substrate p-well 28. The advantages of a device formed according to the method of the invention are described later herein.

Patent Publication WO2003003473 A1, of Yamada et al., published Jan. 9, 2003, describes a non-volatile semiconductor memory cell having a insulating film having charge-trapping properties.

Patent Publication WO0113378 A1, of Kawamura, published Feb. 22, 2001, describes a non-volatile memory having multi charge-trapping regions.

U.S. Pat. No. 6,528,845 B1, to Bude et al., granted Mar. 4, 2003, describes a non-volatile memory device having a charge trapping layer.

U.S. Pat. No. 6,008,091, to Gregor et al., granted Dec. 28, 1999, describes a floating gate MOS transistor with a charge-trapping layer having a relatively low charge trap density.

U.S. Patent Publication No. 2002/000592 A1 of Fujiware, published Jan. 3, 2002, describes a non-volatile memory device having a carrier trap charge storing mechanism.

SUMMARY OF THE INVENTION

A method of fabricating a non-volatile memory device includes preparing a substrate; depositing a layer of $HfO_2$ by atomic layer deposition; annealing the substrate and $HfO_2$ layer in situ; exposing the $HfO_2$ layer to a plasma discharge, thereby forming a charge-trapping layer; depositing a gate structure; and completing the memory device.

It is an object of this invention to provide a layer of a dielectric that efficiently traps and releases charges under a well characterized set of conditions.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 1 depicts a comparison between a prior art MONOS (a) and the device of the method of the invention (b).

FIG. 2 depicts a first embodiment of a memory device constructed according to the method of the invention, showing integration of dual oxide technology with memory transistors on the same circuit performed with two gate dielectric steps.

DETAILED DESCRIPTION OF THE PREFERRED EMBODIMENTS

Figure 3:
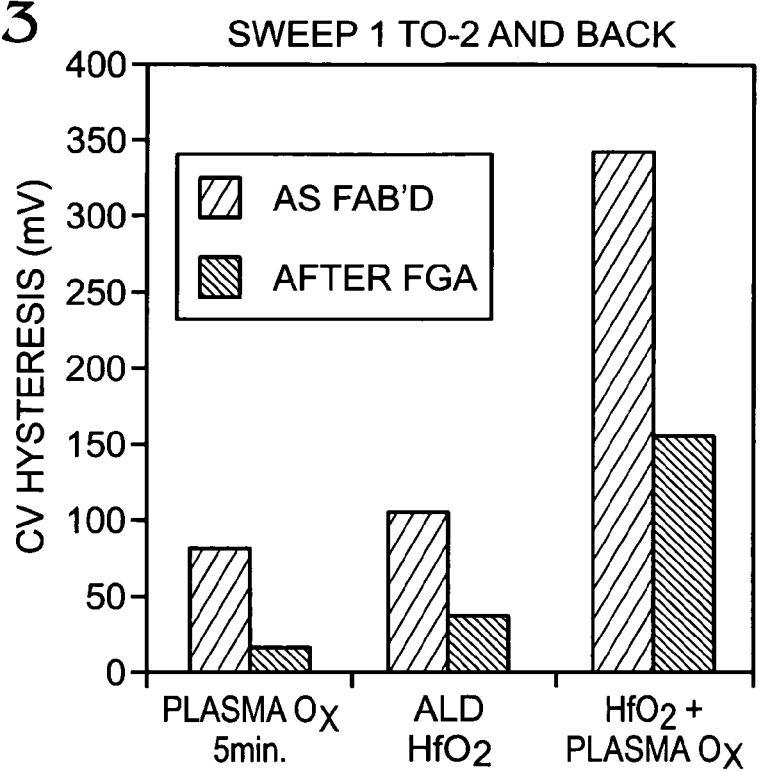
FIG. 3 depicts a CV hysteresis for each process and the combined process before and after FGA.

An advantage of the method of the invention is that as circuits become more complex, as in system-on-chip circuits, two or more gate dielectric thicknesses may be required to be present on the same chip. As shown in the FIG. 2, three types of devices, 40, 50 and 60, are formed on a single substrate 30. A high-speed logic device 40 includes a plasma oxide-formed dielectric layer 42; a memory transistor 50 includes a dielectric layer having a high-k oxide and a plasma exposure; while a low-power logic device 60 includes a high-k dielectric layer 62. Thus, the gate dielectric thickness may include an ALD high-k film 62, where low power logic operations take place, while the other thickness 42, such as where high speed operations take place is formed solely by plasma oxidation. A region of the chip 52, which is exposed to both processes, is appropriate for memory cell applications.

As previously mentioned, an objective of this invention is to form a layer of a dielectric that efficiently traps and releases charges under a well defined set of conditions, so that a memory device may be fabricated. This layer is placed between the channel and the gate of a MOSFET device. A short positive or negative pulse on the gate of an individual device is used to program the state of the memory to a "1" or "0", respectively. The state of the memory is read by measuring the conductance through the device channel when the gate is placed in a "read" condition.

Figure 4:
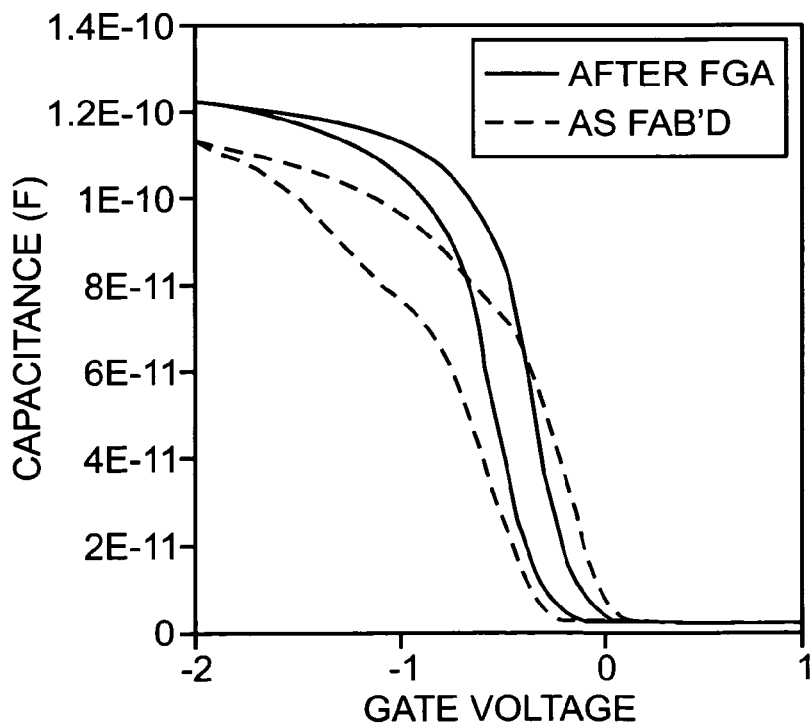
FIG. 4 depicts capacitance curves before and after FGA.
Figure 5:
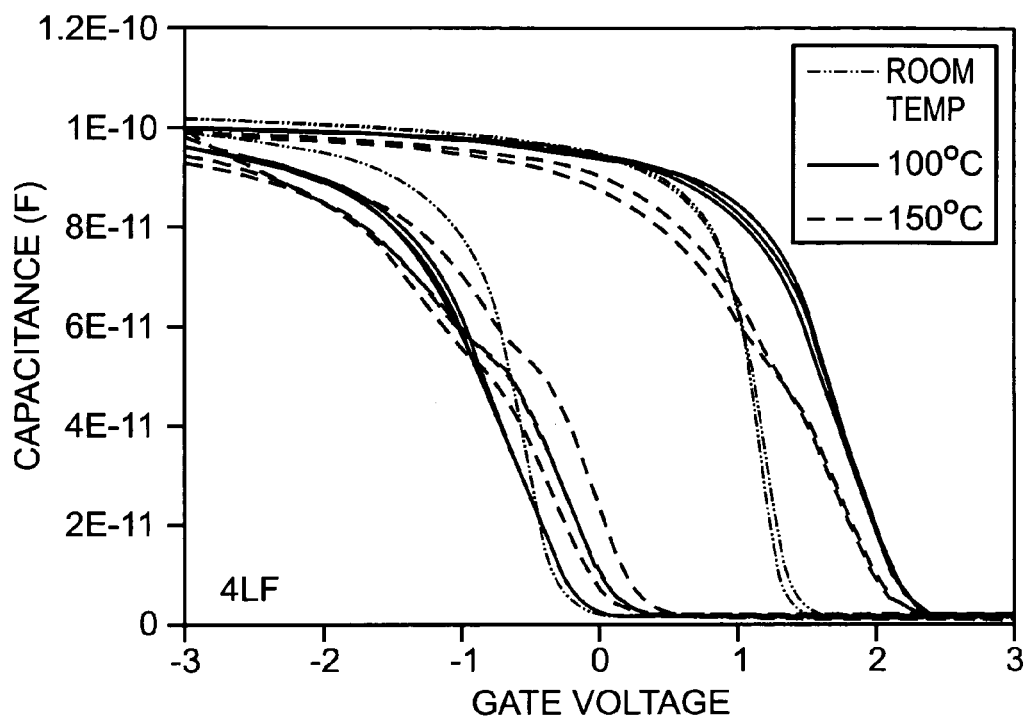
FIG. 5 depicts CV hysteresis curves at various device temperatures.

This efficient charge trapping layer is formed in a two-step process according to the method of the invention. First, an atomic layer deposition (ALD) of a high-k dielectric is performed. Second, exposure to a plasma discharge, usually in the form of a plasma oxidation treatment, which may also grow a high quality gate dielectric, is performed. Taken alone, neither step yields the desired amount of charge trapping, as shown in the magnitude of hysteresis in a dual capacitance-voltage (CV) sweep in FIG. 3. After a forming gas anneal at about 450° C., for about 30 minutes, which is conventionally performed towards the end of an IC fabrication flow, all hysteresis is substantially reduced, however, the $HfO_2$ following exposure to a plasma discharge in the form of plasma oxidation (HfOPO) is still quite large, even when sweeping in this small voltage range, as shown in FIG. 4. The CV curves exhibit an improvement in the CV characteristics after forming gas anneal as shown in FIG. 5 at temperature ranging between about room temperature to 150° C.

When a capacitor with TiN gate and HfOPO dielectric is swept from +5V to −5V and back, the hysteresis is about 2V. At substrate temperatures of between about 100° C. and 150° C., the hysteresis is about the same or larger as shown in the CV sweeps in FIG. 6.

Figure 6:
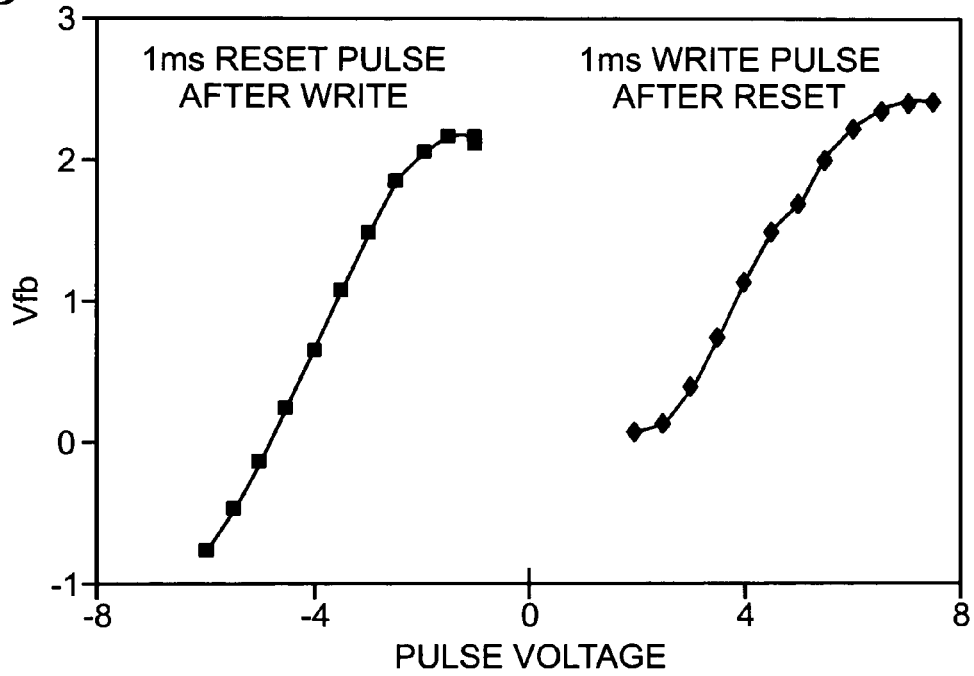
FIG. 6 depicts the write and erase characteristics for a 1 ms pulse.

The effects of applying a 1 ms pulse on the gate are shown in FIG. 6. On the right side, after reset, higher pulse heights drive the flat band voltage (Vfb) higher until about 6.5V is reached when saturation is seen. After setting the device to the "1" condition, a negative pulse will drive the Vfb for lower values. There is no saturation seen in this direction. The value of the Vfb can be varied from between about −1V to +3V, which is a sufficiently large window to easily fabricate a memory device.

Figure 7:
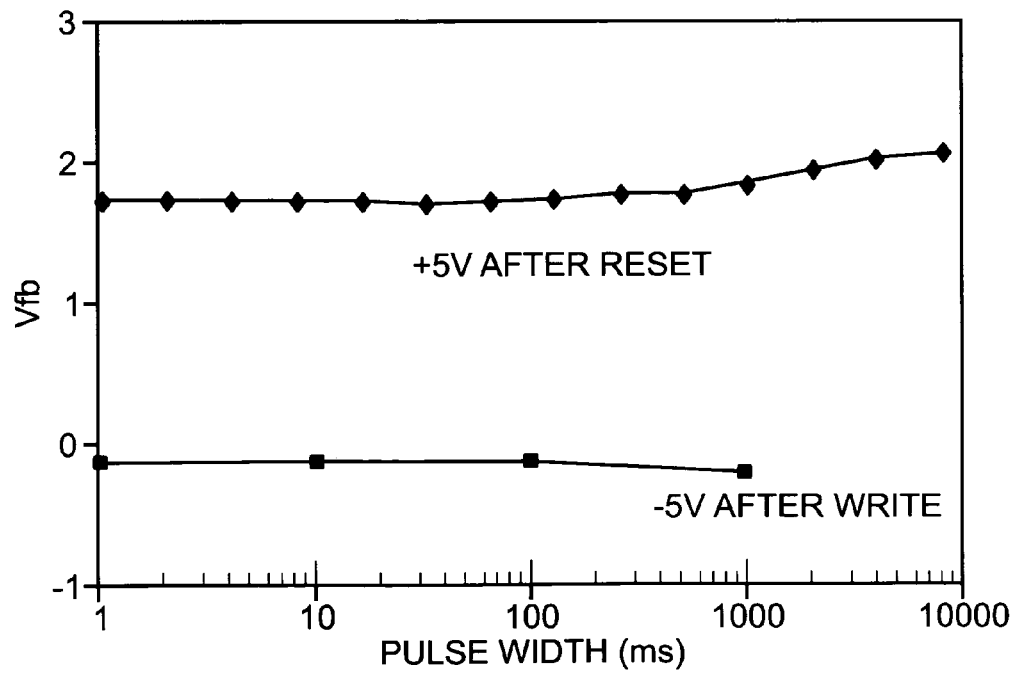
FIG. 7 depicts the effects of pulse width on the write and erase processes when a ±5V pulse is applied.

The effect of pulse width on the eventual Vfb value is shown in FIG. 7, which depicts the effects of pulse width on the write and erase process when ±5V is used. The minimum pulse width capable with current test equipment was 1 ms, however, it appears that pulses having a width of less that 1 ms may be capable of performing the write and erase operations.

Although very little has been done to optimize the ALD high-k thickness and plasma oxidation duration, it is likely that the size of the hysteresis window may be enlarged, enabling either programming at lower voltages or allowing multi-bit programming on a single transistor.

Figure 8:
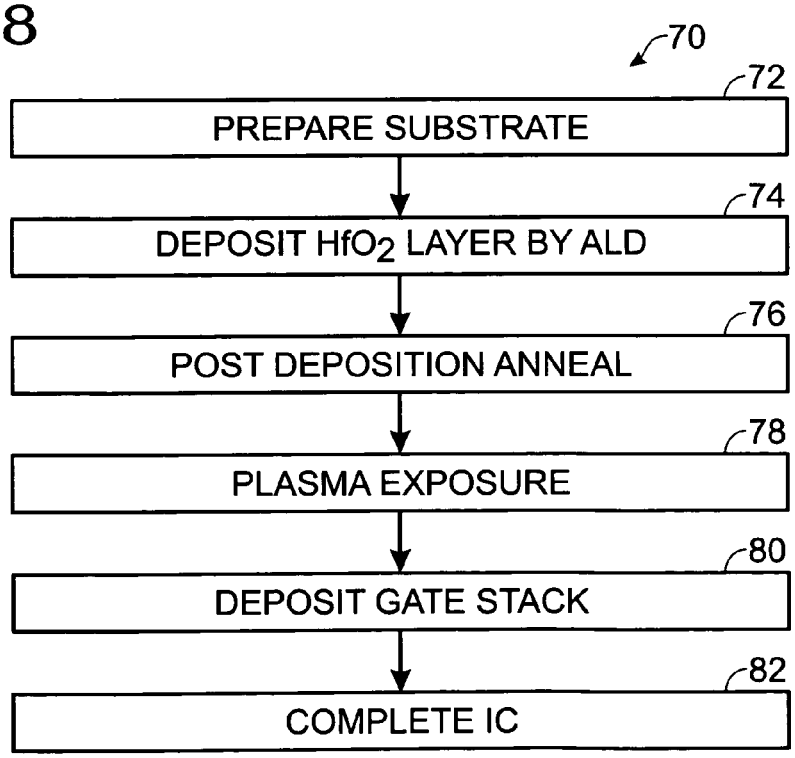
FIG. 8 is a block diagram of the method of the invention.

Fabrication of the charge trap layer deposition according to the method of the invention is as follows, and is illustrated in FIG. 8, generally at 70: The substrate is prepared 72, using standard pre-gate dielectric cleaning steps, typically using SC1 & SC2, finished by a HF bath. Deposition by ALD of atomic layer $HfO_2$, 74, requires heating of the substrate to about 170° C., and introduction of pulses of $Hf(NO_3)_4$, $N_2$, $H_2O$, $N_2$ for, seriatim, 2 seconds, 10 seconds, 0.1 seconds, and 10 ms, which comprises one cycle. A total of 80 to 400 cycles is used. An in-situ post deposition anneal, 76, at about 500° C. for about 60 seconds completes the deposition step of the method of the invention.

The wafer is next placed into a plasma discharge chamber for plasma oxidation, 78, where a wafer chuck is heated to about 380° C. A plasma gas flow of about 70 sccm of He and 3 sccm of $O_2$ is introduced into the chamber, with the pressure controlled to about 100 mTorr. A 13.56 MHz inductively coupled plasma source, at about 700 W, generates a plasma discharge over the wafer, causing oxygen radicals to penetrate the $HfO_2$ film, producing a charge-trapping film. Plasma durations of between about one minute to 30 minutes are used. He may be used alone, or with a mixture of oxygen in a range of 0% to 10%.

A gate is deposited, 80, on the charge trapping film. A TiN layer is reactive sputter-deposited to a thickness of about 100 nm. The gate is patterned and etched, and the device completed, 82, using steps consistent with conventional processing.

For a given thickness of $HfO_2$, an optimum plasma oxidation duration exists. Films that are under-exposed or over-exposed exhibit smaller hysteresis windows. It is conceivable that the combination of processes described herein may be incorporated into an integrated circuit fabrication flow so that either or both ALD of $HfO_2$ and plasma oxidation may be used to form the actual gate dielectric for the peripheral devices, aside from the memory cell array. The ALD of $HfO_2$ has the advantage of offering a lower leakage current for the same effective thickness and would be appropriate for low power applications. Meanwhile a gate oxide formed from plasma oxidation offers a high-quality thin $SiO_2$ layer with no sacrifice in device channel mobilities.

The basic invention may be able to employ a number of alternative high-k dielectrics, such as $ZrO_2$, $TiO_2$, $Ta_2O_5$, $Y_2O_3$, $La_2O_3$, ScO, etc. The plasma oxidation may also be performed by RF frequencies other than 13.56 MHz, and using gases other than $He/O_2$, such as $N_2O$, $H_2O$, or $O_3$.

Thus, a method for fabricating a charge trapping layer using ALD and plasma oxidization has been disclosed. It will be appreciated that further variations and modifications thereof may be made within the scope of the invention as defined in the appended claims.

I claim:

1. A method of fabricating a non-volatile memory device comprising:
   preparing a substrate;
   depositing a layer of high-k dielectric by atomic layer deposition;
   annealing the substrate and high-k dielectric layer in situ;
   exposing the high-k dielectric layer to a plasma discharge, thereby forming a charge-trapping layer;
   depositing a gate structure; and
   completing the memory device.

2. The method of claim 1 wherein said depositing a high-k dielectric layer includes depositing a layer dielectric taken from the group of dielectrics consisting of $HfO_2$, $ZrO_2$, $TiO_2$, $Ta_2O_5$, $Y_2O_3$, $La_2O_3$, and ScO.

3. The method of claim 2 wherein said depositing a layer of high-k dielectric includes depositing a layer of $HfO_2$, and which further includes heating the substrate to about 170° C., and introduction of pulses of $Hf(NO_3)_4$, $N_2$, $H_2O$, $N_2$ for, seriatim, 2 seconds, 10 seconds, 0.1 seconds, and 10 ms, comprising one cycle; repeating the process for between about 80 cycles to 400 cycles.

4. The method of claim 1 wherein said annealing in-situ includes annealing at about 500° C. for about 60 seconds.

5. The method of claim 1 wherein said plasma exposure includes heating a wafer chuck to about 380° C.; and introducing a plasma gas at a flow rate of about 70 sccm of He and 3 sccm of a gas taken from the group of gases consisting of $O_2$, $O_3$, $N_2O$ and $H_2O$, at a chamber pressure of about 100 mTorr.; generating a plasma discharge over the wafer at an inductively coupled frequency of about 13.56 MHz at about 700 W; thereby generating a plasma discharge over the wafer, causing oxygen radicals to penetrate the $HfO_2$ film, producing a charge-trapping film, maintaining the plasma discharge for between about one minute to 30 minutes.

6. The method of claim 1 wherein said depositing a gate structure includes depositing a layer of TiN to a thickness of about 100 nm.

7. A method of fabricating a non-volatile memory device comprising:

preparing a substrate;

depositing a layer of high-k dielectric, taken from the group of dielectrics consisting of $HfO_2$, $ZrO_2$, $TiO_2$, $Ta_2O_5$, $Y_2O_3$, $La_2O_3$, and ScO, by atomic layer deposition;

annealing the substrate and high-k dielectric layer in situ;

plasma oxidizing the high-k dielectric layer, thereby forming a charge-trapping layer;

depositing a gate structure; and completing the memory device.

8. The method of claim 7 wherein the high-k dielectric is $HfO_2$, and wherein said depositing a layer of high-k dielectric includes heating the substrate to about 170° C., and introduction of pulses of $Hf(NO_3)_4$, $N_2$, $H_2O$, $N_2$ for, seriatim, 2 seconds, 10 seconds, 0.1 seconds, and 10 ms, comprising one cycle; repeating the process for between about 80 cycles to 400 cycles.

9. The method of claim 7 wherein said annealing in-situ includes annealing at about 500° C. for about 60 seconds.

10. The method of claim 7 wherein said plasma oxidizing includes heating a wafer chuck to about 380° C.; and introducing a plasma gas at a flow rate of about 70 sccm of He and 3 sccm of a gas taken from the group of gases consisting of $O_2$, $O_3$, $N_2O$ and $H_2O$, at a chamber pressure of about 100 mTorr.; generating a plasma discharge over the wafer at an inductively coupled frequency of about 13.56 MHz at about 700 W; thereby generating a plasma discharge over the wafer, causing oxygen radicals to penetrate the $HfO_2$ film, producing a charge-trapping film, maintaining the plasma discharge for between about one minute to 30 minutes.

11. The method of claim 7 wherein said depositing a gate structure includes depositing a layer of TiN to a thickness of about 100 nm.

12. A method of fabricating a non-volatile memory device comprising:

preparing a substrate;

depositing a layer of $HfO_2$ by atomic layer deposition;

annealing the substrate and $HfO_2$ layer in situ;

exposing the $HfO_2$ layer to a plasma discharge, thereby forming a charge-trapping layer;

depositing a gate structure; and completing the memory device.

13. The method of claim 12 wherein said depositing a layer of $HfO_2$ further includes heating the substrate to about 170° C., and introduction of pulses of $Hf(NO_3)_4$, $N_2$, $H_2O$, $N_2$ for, seriatim, 2 seconds, 10 seconds, 0.1 seconds, and 10 ms, comprising one cycle; repeating the process for between about 80 cycles to 400 cycles.

14. The method of claim 12 wherein said annealing in-situ includes annealing at about 500° C. for about 60 seconds.

15. The method of claim 12 wherein said plasma exposure includes heating a wafer chuck to about 380° C.; and introducing a plasma gas at a flow rate of about 70 sccm of He and 3 sccm of a gas taken from the group of gases consisting of $O_2$, $O_3$, $N_2O$ and $H_2O$, at a chamber pressure of about 100 mTorr.; generating a plasma discharge over the wafer at an inductively coupled frequency of about 13.56 MHz at about 700 W; thereby generating a plasma discharge over the wafer, causing oxygen radicals to penetrate the $HfO_2$ film, producing a charge-trapping film, maintaining the plasma discharge for between about one minute to 30 minutes.

16. The method of claim 12 wherein said depositing a gate structure includes depositing a layer of TiN to a thickness of about 100 nm.

\* \* \* \* \*